United States Patent
Yang et al.

(10) Patent No.: US 6,908,806 B2
(45) Date of Patent: Jun. 21, 2005

(54) GATE METAL RECESS FOR OXIDATION PROTECTION AND PARASITIC CAPACITANCE REDUCTION

(75) Inventors: Haining Yang, Wappingers Falls, NY (US); Ramachandra Divakaruni, Ossining, NY (US); Oleg Gluschenkov, Poughkeepsie, NY (US); Rajeev Malik, Pleasantville, NY (US); Hongwen Yan, Somers, NY (US); Ravikumar Ramachandran, Pleasantville, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/355,726

(22) Filed: Jan. 31, 2003

(65) Prior Publication Data

US 2004/0150056 A1 Aug. 5, 2004

(51) Int. Cl.[7] ................. H01L 21/8238; H01L 21/3205; H01L 21/4763

(52) U.S. Cl. ........................ 438/216; 438/585; 438/591; 438/595

(58) Field of Search ................................. 257/412, 413, 257/410, 411; 438/585, 981, 587, 279, 588, 592, 216, 261, 421, 591, 595, 287, 954

(56) References Cited

U.S. PATENT DOCUMENTS

| | | | |
|---|---|---|---|
| 5,751,048 A | * | 5/1998 | Lee et al. ................... 257/412 |
| 6,380,607 B2 | | 4/2002 | Seo |
| 6,417,558 B1 | | 7/2002 | Shirai |
| 6,448,140 B1 | * | 9/2002 | Liaw .......................... 438/279 |
| 6,531,776 B2 | | 3/2003 | Lin et al. |

* cited by examiner

*Primary Examiner*—Steven Loke
(74) *Attorney, Agent, or Firm*—Slater & Matsil, L.L.P.

(57) ABSTRACT

A method of fabricating a semiconductor device having a gate stack structure that includes gate stack sidewall, the gate stack structure having one or more metal layers comprising a gate metal is provided. The gate metal is recessed away from the gate stack sidewall using a chemical etch. The gate metal of the gate stack structure is selectively oxidized to form a metal oxide that at least partly fills the recess.

7 Claims, 4 Drawing Sheets

GATE METAL RECESS FOR OXIDATION PROTECTION AND PARASITIC CAPACITANCE REDUCTION

BACKGROUND OF THE INVENTION

The present invention relates to methods of fabricating semiconductor devices which facilitate reducing parasitic capacitance and improving oxidation protection.

As devices shrink and new metals such as tungsten (W) are required for semiconductors, it becomes much more difficult to control and tolerate gate metal oxidation. Formation of metal oxide during selective oxidation of the gate metal results in gate sidewalls having ridges or bumps at the location of the gate metal due to extrusion of the metal oxide forming there. When a spacer is then deposited, it tends to be thinner on the gate sidewalls where the metal oxide extrudes. A thin spacer may cause gate metal oxidation during following oxide deposition and steam anneal and may result in gate metal opens or shorts.

A schematic of the gate stack of a typical transistor 100 is shown in FIG. 1, where the stack composes gate cap nitride 105, conductive metal 104 (such as W or $WSi_x$), and polysilicon 103. A gate oxide 102 separates the gate stack from the Si substrate 101. The shape of the stack is defined by lithographic masking and reactive ion etch ("RIE") steps. The sidewall 109 of the gate stack is normally smooth after the stack is formed but prior to selective oxidation.

Turning to FIG. 2, a selective oxidation anneal is typically performed after the stack is formed to improve gate oxide reliability. The metal 204 surface is also oxidized during the oxidation anneal and the metal oxide 206 extrudes towards the sides of the stack, in part due to the volume expansion.

As depicted in FIG. 3, after selective oxidation and ion implants, a gate spacer 307 (commonly, $Si_3N_4$) is deposited on the stack. A blanket RIE is performed to remove the $Si_3N_4$ from the gate oxide surface. The spacer 307 is deposited in a thinner layer on the gate metal 304 due to the metal oxide 306 extrusion. This thinner spacer layer results in an undesirable increase in metal oxidation during the following oxide deposition and steam anneal, and also possibly causes unwanted gate metal-to-gate metal or wordline-to-bitline shorts.

A need exists for a process of semiconductor fabrication that prevents thinning of the gate spacer on the gate metal due to metal oxide extrusion.

SUMMARY OF THE INVENTION

The present invention provides a method of fabricating a semiconductor device having a dielectric structure on which a gate stack with a gate stack surface is formed. The gate stack includes one or more gate metal layers comprising a gate metal. The method of fabrication includes laterally recessing the gate metal from the gate stack surface by a chemical etch.

Additionally, the chemical etch may be by a gas or wet etching solution.

Preferably, the above method further includes selective oxidation of the gate metal to form a smooth or flat gate stack sidewall. It also may include depositing a spacer on the smooth gate stack sidewall.

The invention may further include a semiconductor device, which may include transistors, comprising a dielectric structure on which a gate stack having a gate stack surface is formed. Preferably, the gate stack has one or more gate metal layers comprising a gate metal recessed from the gate stack surface.

In accordance with an embodiment, the semiconductor device comprising a dielectric structure on which a gate stack having a gate stack surface is formed, the gate stack having flat stack sidewalls after selective oxidation of the gate metal.

In another embodiment, the semiconductor device described above may include a spacer deposited on the flat stack sidewalls.

DETAILED DESCRIPTION

"Parasitic capacitance" as used herein refers to capacitance between gate metal and gate metal or gate metal and bitline. Capacitance is directly related to the permittivity of the dielectric separating components and is inversely related to the separation distance. Thus, recessing the gate metal has the effect of increasing the separation distance and thereby reducing parasitic capacitance.

"Smooth" and "flat" as used interchangeably herein refer to the relative lack of ridges, bumps and valleys on a surface. In accordance with the present invention, the use of smooth or flat to describe the gate stack wall produced by the method of semiconductor fabrication presented herein does not mean that that there are absolutely no ridges, bumps, or valleys in such a gate stack wall. These terms are used only to illustrate that the severity of such ridges, bumps or valleys in the gate stack wall is significantly diminished vis-à-vis a gate stack wall produced using previously known methods having extrusions of metal oxide creating such ridges, bumps or valleys.

"Thin" and "thick" as used herein are relative terms. In particular, the use of "thinner" to describe the thickness of spacer in the areas of metal oxide extrusion of semiconductors produced using typical methods of the prior art refer to a relatively reduced thickness of the spacer in such areas versus other areas of the same semiconductor. This is also in comparison with the relatively thicker spacer in the metal oxide area of a similar semiconductor produced using a method of the present invention.

"Evenly" is used herein to describe a layering of uniform thickness. It is understood that depositing a coating evenly does not mean that the substance is of identical thickness in all areas. Such use of "evenly" is intended to convey a general overall equal thickness, without particular areas of undesirable thinness, such as is prevalent in gate spacers over metal oxide extrusions in typical semiconductor devices.

"Reactive ion etch" ("RIE") is used herein to refer to etching methods which combine plasma etching and ion beam etching principles. The combination brings the benefits of chemical plasma etching along with the benefits of directional ion milling.

A new process scheme is advantageously provided to recess the gate metal during or after gate stack RIE so that the gate stack sidewalls are relatively flat after selective oxidation anneal. It may be advantageous to recess the gate metal so that a thicker spacer (i.e., silicon nitride) is formed on gate metal to prevent or reduce unwanted oxidation of the gate metal. This process will also reduce parasitic capacitance of gate metal to gate metal or gate metal to bitline. Parasitic capacitance reduces device speed and its reduction is significantly advantageous.

Figure 4:
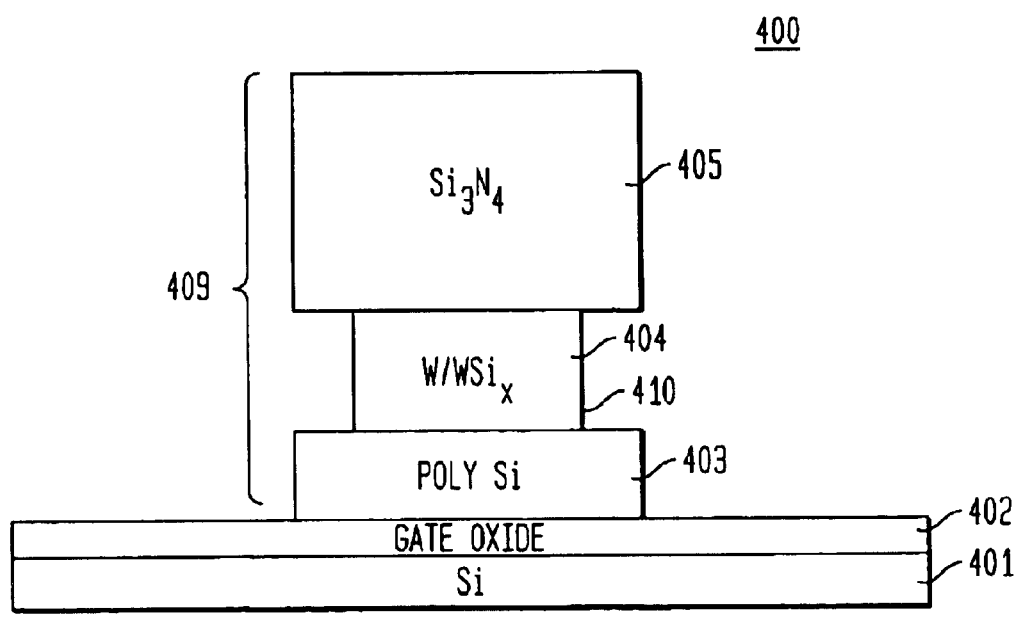
FIG. 4 is a schematic diagram of a profile of a gate stack of a typical transistor after gate metal is recessed from the stack sidewall in accordance with an embodiment of the present invention.

In accordance with an embodiment of the present invention, a process is provided to advantageously recess the gate metal from the gate stack surface by a chemical etch selective to the metal, as indicated in FIG. 4. The etch chemicals can be gaseous or wet solutions. The metal recess etch can be performed during or after the gate stack RIE. An exemplary gate stack composes a gate cap nitride 405, conductive metal 404 (such as W or WSi$_x$), and polysilicon 403.

Although the figures specify Si$_3$N$_4$, W, WSi$_x$, PolySi, and Si as components of the semiconductor device throughout, it is understood that the figures are exemplary in nature and that other elements and compounds may be used in place of those depicted.

A gate oxide 402 separates the gate stack from the Si substrate 401. The shape of the gate stack is defined by lithographic masking and RIE steps. The sidewall 409 of the gate stack, which is normally smooth, is instead recessed at the gate metal surface 410 from the remainder of the stack sidewall 409 in accordance with an embodiment of the present invention.

Recessing the gate metal is preferably accomplished using a chemical wet or gaseous etch. These etching techniques are well known to those of ordinary skill in the art. Using known etching techniques to recess the gate metal prior to selective oxidation is an advantageous aspect of the present invention.

Figure 1:
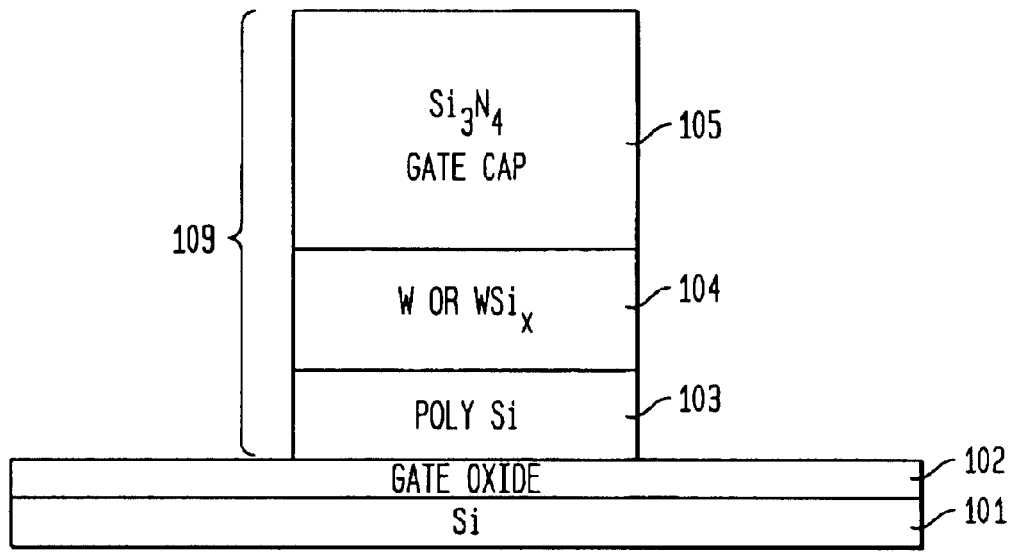
FIG. 1 is a schematic diagram of a profile of a gate stack of a known typical transistor prior to selective oxidation anneal.
Figure 2:
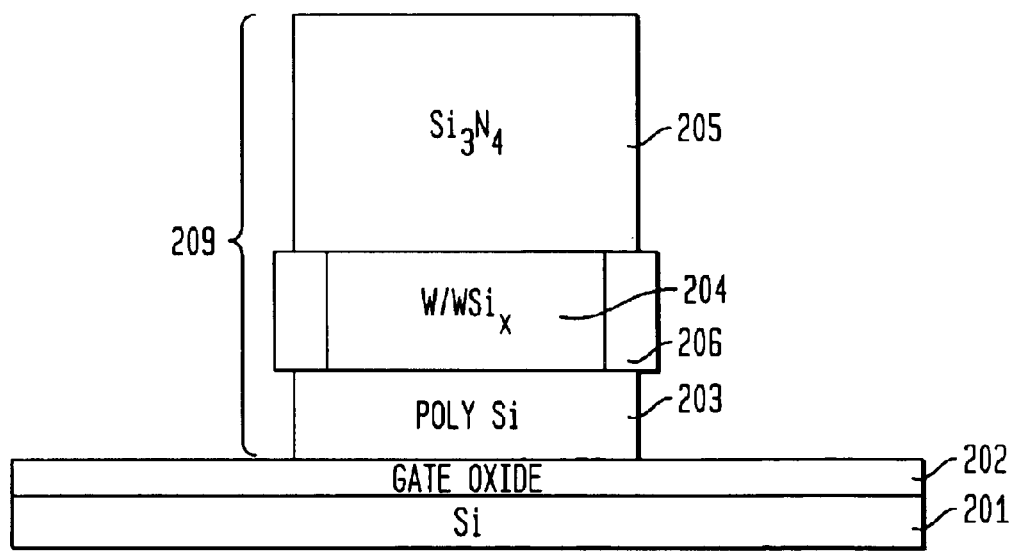
FIG. 2 is a schematic diagram of a profile of a gate stack of a known typical transistor depicting metal oxide formed during selective oxidation anneal.
Figure 5:
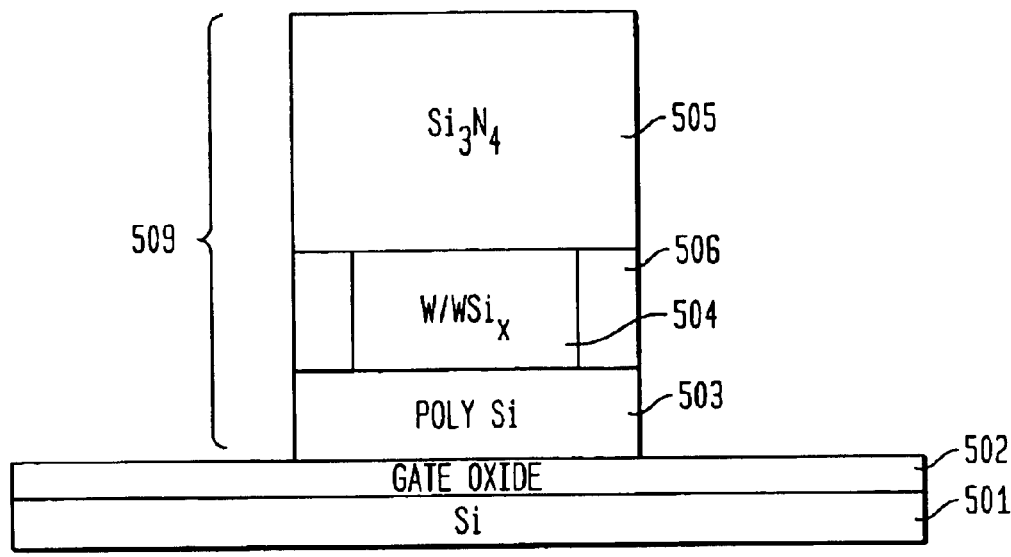
FIG. 5 is a schematic diagram of a profile of a gate stack of a typical transistor after selective oxidation in accordance with an embodiment of the present invention.

A profile of a gate stack of a typical transistor after selective oxidation in accordance with an embodiment of the present invention is presented in FIG. 5. Note that the gate stack sidewall 509 may be smoothed significantly by the selective oxidation process filling the gate metal recess with metal oxide 506. The gate stack sidewall 509 has not only been smoothed or flattened relative to the sidewall 409 prior to selective oxidation (as in FIG. 4), but also relative to the sidewall 209 formed after selective oxidation in a representative prior art process (as depicted in FIG. 2).

Figure 3:
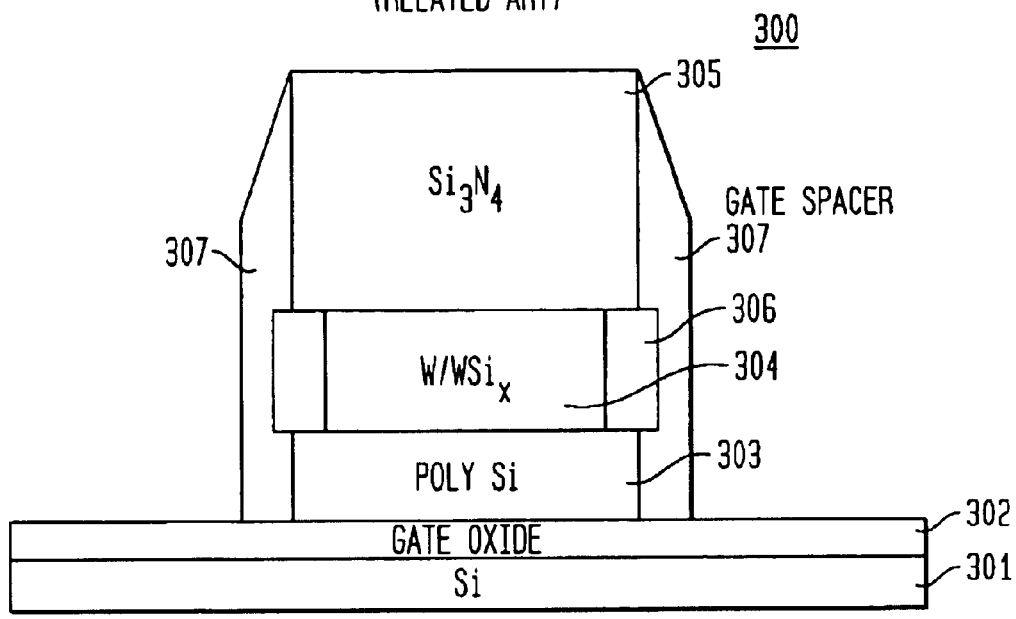
FIG. 3 is a schematic diagram of a profile of a gate stack of a known typical transistor after deposition of a gate spacer.
Figure 6:
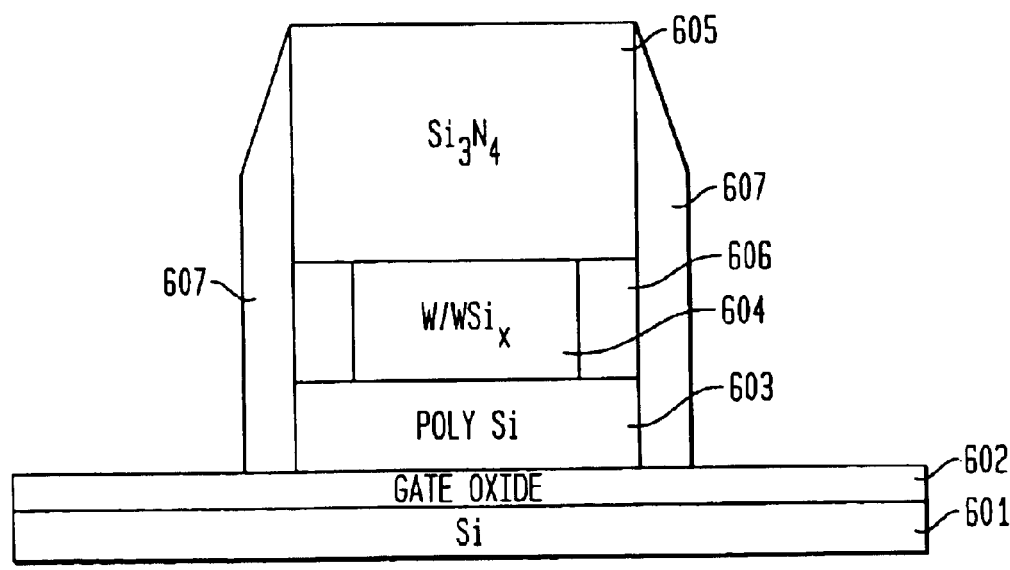
FIG. 6 is a schematic diagram of a profile of a gate stack of a typical transistor after deposition of a gate spacer in accordance with an embodiment of the present invention.

A schematic diagram of a profile of a gate stack of a typical transistor after deposition of a gate spacer 607 in accordance with an embodiment of the present invention is depicted in FIG. 6. Note the improved thickness of spacer over the gate metal oxide 606 versus a typical relatively thin gate spacer 307 of the prior art(as depicted in FIG. 3). This improved thickness is a direct result of the smooth gate stack sidewall produced by first etching the gate metal to form a recess and the follow-up selective oxidation which serves to fill the recess so formed.

As described herein, gate metal 604 may also be recessed such that a thicker spacer 607 is formed on the gate stack sidewall over the gate metal oxide to advantageously prevent metal oxidation, depending on the resistance of the metal to oxidation. For example, tungsten (W) metal is more easily oxidized than WSi$_x$, and hence a thicker spacer is preferred.

Figure 7:
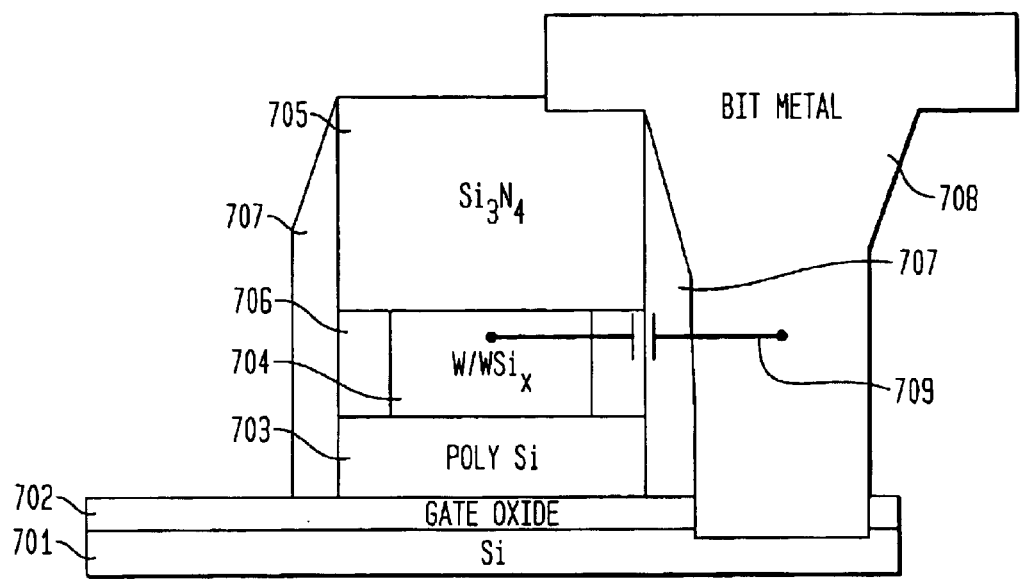
FIG. 7 is a schematic diagram of a profile of a gate stack and bit metal of a typical transistor showing area of reduced parasitic capacitance in accordance with an embodiment of the present invention.

This process will also reduce the gate parasitic capacitance by increasing the thickness of the spacer between the gate metals and by increasing the thickness of the spacer between bitline metal 708 and gate metal 704, as shown in FIG. 7. Parasitic capacitance slows device speed. An exemplary area of reduced parasitic capacitance 709 has been created using the inventive step of recessing the gate metal 704 prior to selective oxidation. Reduced leakage of electrons between the bit metal and the gate stack is an advantageous result of the present invention.

Figure 8:
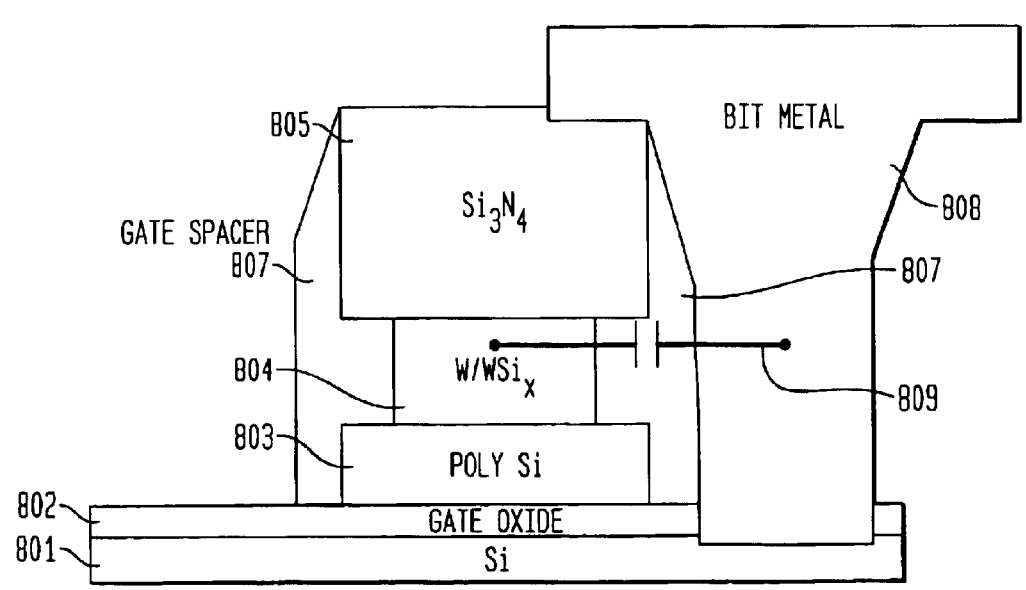
FIG. 8 is a schematic diagram of a profile of a gate stack and bit metal of a typical transistor with recessed gate metal showing area of reduced parasitic capacitance in accordance with an embodiment of the present invention.

FIG. 8 is a schematic diagram of a profile of a gate stack and bit metal 808 of a typical transistor with recessed gate metal 804 showing area of reduced parasitic capacitance 809 in accordance with another embodiment of the present invention. As in FIG. 7, the gate parasitic capacitance is reduced by increasing the thickness of the spacer 807 between the gate metals 804 and between the gate metal 804 as well as between the bitline metal 808. The parasitic capacitance measured in the area 809 has been created by the resulting increase to the thickness of the spacer 807 due at least in part to the recessing of the gate metal 804.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A method of fabricating a semiconductor device, the semiconductor device including a gate stack structure having at least one gate stack sidewall, the gate stack structure including one or more metal layers forming a gate metal, said method comprising:

recessing the gate metal away from the gate stack sidewall using a chemical etch; and selectively oxidizing only the gate metal of the gate stack structure to form a gate metal oxide that at least partly fills the recess.

2. The method of claim 1, wherein the chemical etch is carried out using a gaseous etching solution.

3. The method of claim 1, wherein the chemical etch is carried out using a wet etching solution.

4. The method of claim 1, further comprising forming a gate spacer on the gate stack sidewall.

5. The method of claim 1, wherein the gate metal is disposed above a gate oxide.

6. The method of claim 1, wherein the gate metal includes at least one of W and WSi$_x$.

7. A method of fabricating a semiconductor device, the semiconductor device including a gate stack structure having at least one gate stack sidewall, the gate stack structure including one or more metal layers forming a gate metal, said method comprising:

recessing the gate metal away from the gate stack sidewall using a chemical etch;

selectively oxidizing only the gate metal of the gate stack structure to form a gate metal oxide that at least partly fills the recess; and forming a gate spacer on the gate stack sidewall.

* * * * *